United States Patent
Okuyama et al.

(10) Patent No.: US 9,537,035 B2
(45) Date of Patent: Jan. 3, 2017

(54) BACK-FACE PROTECTION SHEET FOR SOLAR CELL MODULE, AND SOLAR CELL MODULE USING SAME

(71) Applicant: Toray Advanced Film Co., Ltd., Tokyo (JP)

(72) Inventors: Futoshi Okuyama, Mishima (JP); Kouhei Katou, Mishima (JP); Yuuka Ashida, Mishima (JP); Masahiro Mikawa, Mishima (JP); Masayoshi Teranishi, Mishima (JP)

(73) Assignee: Toray Advanced Film Co., Ltd. (JP)

( * ) Notice: Subject to any disclaimer, the term of this patent is extended or adjusted under 35 U.S.C. 154(b) by 56 days.

(21) Appl. No.: 14/714,391

(22) Filed: May 18, 2015

(65) Prior Publication Data
US 2015/0249174 A1 Sep. 3, 2015

Related U.S. Application Data

(62) Division of application No. 13/819,841, filed as application No. PCT/JP2011/069514 on Aug. 30, 2011, now Pat. No. 9,064,995.

(30) Foreign Application Priority Data

Aug. 31, 2010 (JP) .................................. 2010-193144

(51) Int. Cl.
*H01L 31/049* (2014.01)
*H01L 31/048* (2014.01)
(Continued)

(52) U.S. Cl.
CPC ............. *H01L 31/049* (2014.12); *B32B 27/08* (2013.01); *B32B 27/20* (2013.01); *B32B 27/32* (2013.01);
(Continued)

(58) Field of Classification Search
CPC ........ C09J 175/04; C09J 175/06; B32B 27/08; B32B 27/12; B32B 27/20; B32B 27/32; B32B 27/36; B32B 27/40; B32B 2250/24; H01L 31/048; H01L 31/0481; H01L 31/049; Y02E 10/50
(Continued)

(56) References Cited

U.S. PATENT DOCUMENTS

| | | |
|---|---|---|
| 2006/0166023 A1 | 7/2006 | Yoshikata et al. |
| 2010/0229945 A1 | 9/2010 | Suzuta et al. |
| 2011/0108094 A1 | 5/2011 | Nishijima et al. |

FOREIGN PATENT DOCUMENTS

| | | |
|---|---|---|
| JP | 2001-111073 A | 4/2001 |
| JP | 2002-026354 A | 1/2002 |

(Continued)

*Primary Examiner* — Thao T Tran
(74) *Attorney, Agent, or Firm* — DLA Piper LLP (US)

(57) ABSTRACT

A back-face protection sheet for a solar cell module exhibits excellent adhesion strength and tensile strength even under a high-temperature and high-humidity environment, by using a plastic film that has excellent characteristics such as electrical insulation characteristic, heat resistance, dimension stability, mechanical strength, weatherability, and water resistance, and using a two-part type lamination adhesive having excellent weatherability. The back-face protection sheet is made to have excellent adhesion strength and tensile strength for a long period of time, even under a high-temperature and high-humidity environment, by improving weatherability (hydrolysis resistance) as base material films, and giving weatherability (hydrolysis resistance) to the two-part type lamination adhesive to be used in pasting together the base material films.

9 Claims, 4 Drawing Sheets

(51) Int. Cl.
  *B32B 27/08*    (2006.01)
  *B32B 27/20*    (2006.01)
  *B32B 27/32*    (2006.01)
  *B32B 27/36*    (2006.01)

(52) U.S. Cl.
  CPC ............ *B32B 27/36* (2013.01); *H01L 31/048* (2013.01); *H01L 31/0481* (2013.01); *Y02E 10/50* (2013.01)

(58) Field of Classification Search
  USPC ... 136/259; 428/423.1, 423.7, 424.8; 528/44
  See application file for complete search history.

(56) References Cited

FOREIGN PATENT DOCUMENTS

| | | | | |
|---|---|---|---|---|
| JP | 2002-100788 A | 4/2002 | | |
| JP | 2002-134771 A | 5/2002 | | |
| JP | 2007-320218 A | 12/2007 | | |
| JP | 2008-4691 A | 1/2008 | | |
| JP | 2011051124 A | * | 3/2011 | ............ Y02E 10/50 |

* cited by examiner

BACK-FACE PROTECTION SHEET FOR SOLAR CELL MODULE, AND SOLAR CELL MODULE USING SAME

TECHNICAL FIELD

This disclosure relates to a back face protection sheet for solar cell modules, and a solar cell module using the same and, more specifically, it relates to a back face protection sheet for solar cell modules produced by bonding two or more kinds of plastic films particularly high in electrical insulation performance, heat resistance, and dimensional stability and also good in other characteristics such as mechanical strength, weather resistance, and water resistance, wherein a highly weather resistant adhesive is used to prevent deterioration in adhesive strength between the plastic films in a high-temperature, high-humidity environment, and the use of a highly hydrolysis resistant polyethylene terephthalate film serves to prevent deterioration in tensile strength of the back face protection sheet.

BACKGROUND

With increasing awareness about environment problems in recent years, greater attention is focused on solar batteries as a clean energy source. Development activities and proposals have been made for various types of solar cell modules. In general, solar cell modules contains a photovoltaic cell such as crystalline silicon photovoltaic cell and amorphous silicon photovoltaic cell, and they are produced by laminating a surface protection sheet, a encapsulant sheet of, for instance, ethylene-vinyl acetate copolymer resin, a photovoltaic cell, encapsulant sheet, and a back face protection sheet layer, stacked in that order and integrated by vacuum aspiration and thermocompression bonding. Back face protection sheets used in solar cell modules are generally produced from a plastic base material that is lightweight and high in electric characteristics and strength.

Solar batteries are required to maintain high performance for a long term of 20 years or more. Back face protection sheets used in solar cell modules must have high strength, weather resistance, heat resistance, water resistance, light resistance, chemical resistance, light reflectivity, light diffusion properties, moisture resistance, antifouling properties, design properties, etc., which are required to be maintained for a long period without deterioration.

For solar cell modules, back face protection sheets containing a polyester film, such as polyethylene terephthalate, which has high weather resistance and electrical insulating properties, have been developed. Techniques for improving weather resistance and hydrolysis resistance, which polyester film inherently lacks, disclosed so far include using a material containing a ultraviolet absorber (Japanese Unexamined Patent Publication (Kokai) No. 2001-111073), specifying a content of a cyclic oligomer in a polyester film (Japanese Unexamined Patent Publication (Kokai) Nos. 2002-100788 and 2002-134771), and specifying a molecular weight of a polyester film (Japanese Unexamined Patent Publication (Kokai) No. 2002-26354).

When using such a polyester film in combination with other materials to form a layered body, it is important to select a suitable adhesive for their bonding, and the known suitable ones include polyurethane based adhesives containing a carbodiimide compound, oxazoline compound, or epoxy compound (Japanese Unexamined Patent Publication (Kokai) Nos. 2008-004691 and 2007-320218).

There is nonetheless a need to provide a back face protection sheet for solar cell modules that does not suffer from significant deterioration in adhesive strength over a long term use under high-temperature, high-humidity conditions.

SUMMARY

We found that an excellent back face protection sheet for solar cell modules that does not suffer significant deterioration in adhesive strength or tensile strength over a long term use under high-temperature, high-humidity conditions can be produced by using a base material film with improved weather resistance (hydrolysis resistance) and using an adhesive with weather resistance (hydrolysis resistance) for its bonding.

Specifically, we provide a back face protection sheet for solar cell modules characterized by being produced by bonding a hydrolysis resistant polyethylene terephthalate film with a layered body or with another film by means of an adhesive that is produced by mixing 100 parts by weight a polyester polyol (a) with 5 to 30 parts by weight of an epoxy resin (b), 5 to 30 parts by weight of a polycarbonate polyol (c), 1 to 10 parts by weight of a carbodiimide compound (d), and 10 to 30 parts by weight of a polyisocyanate compound (e).

We thus obtain a back face protection sheet for solar cell modules having high weather resistance, heat resistance, and water resistance and does not suffer from a significant decrease in adhesive strength under harsh conditions such as 85° C., 85% RH, and 1,000 hours, nor suffer from a significant decrease in tensile strength under conditions such as 120° C., 100% RH, 48 hours.

EXPLANATION OF NUMERALS

1: polyethylene film
2: white plastic film
3, 14: hydrolysis resistant polyethylene terephthalate film
4, 5, 15: adhesive layer
8: surface protection sheet for solar cell module
9: photovoltaic cell
10, 18: encapsulant layer
7, 11, 13, 17: solar battery back face protection sheet
12: white polyethylene film or white polypropylene film
16: black plastic film

DETAILED DESCRIPTION

The back face protection sheet for solar cell modules is a back face protection sheet for solar cell modules produced by bonding a hydrolysis resistant polyethylene terephthalate film with a layered body or with another film by an adhesive.

More specifically, it may be configured to be a back face protection sheet for solar cell modules including a polyethylene film, white plastic film, and hydrolysis resistant polyethylene terephthalate film stacked in that order, a back face protection sheet for solar cell modules including a polyethylene film, black plastic film, and hydrolysis resistant polyethylene terephthalate film stacked in that order, or a back face protection sheet for solar cell modules including a white polyethylene film and hydrolysis resistant polyethylene terephthalate film, or white polypropylene film and hydrolysis resistant polyethylene terephthalate film, stacked in that order, to meet different requirements.

An important feature is that an adhesive containing a polyester polyol, epoxy resin, polycarbonate polyol, carbodiimide compound, and polyisocyanate compound is used for the adhesion between the films.

The configuration of the back face protection sheet for solar cell modules and the solar cell module including it is described in detail with reference to the drawings.

Figure 1:
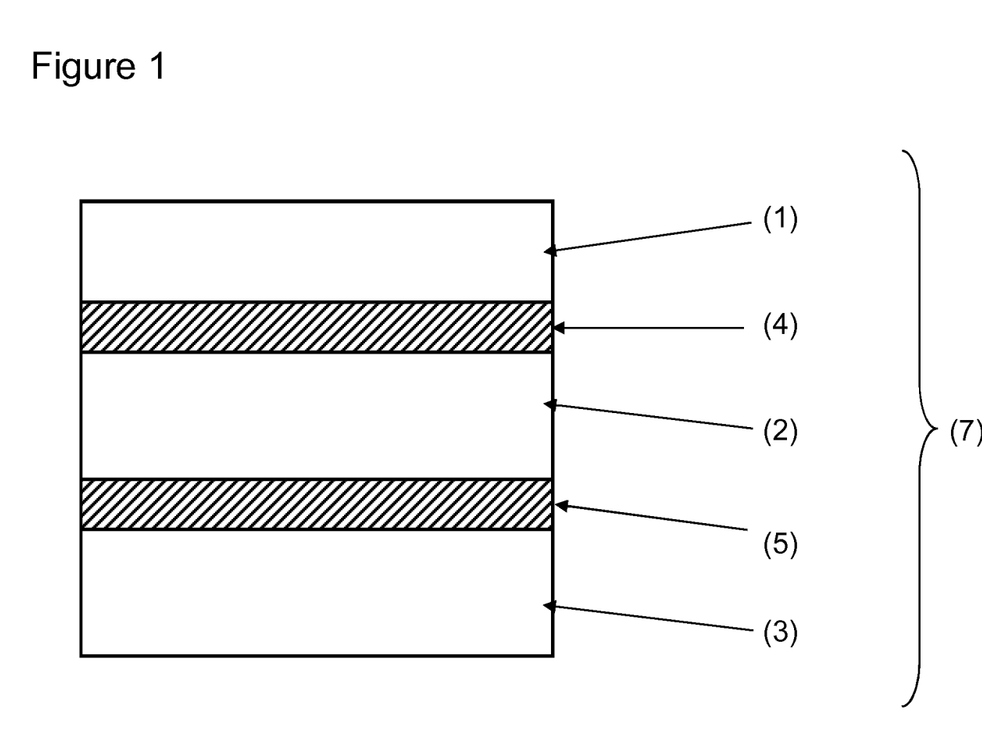
FIG. 1 is a schematic cross section illustrating an example of our back face protection sheet for solar cell modules.
Figure 2:
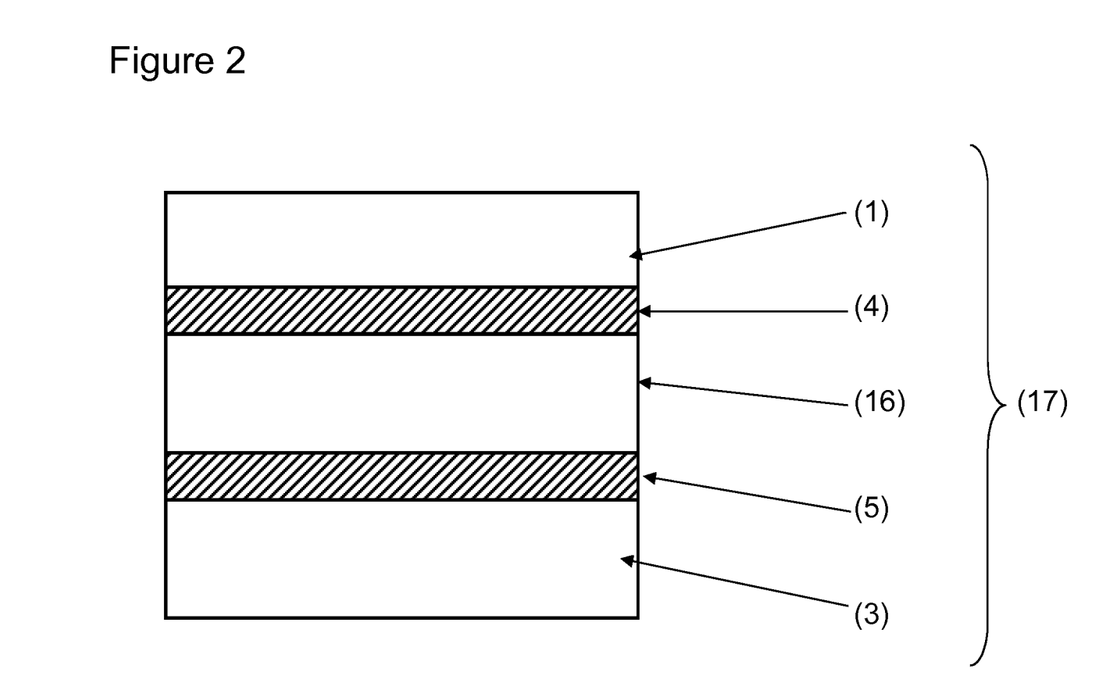
FIG. 2 is a schematic cross section illustrating an example of our back face protection sheet for solar cell modules.
Figure 3:
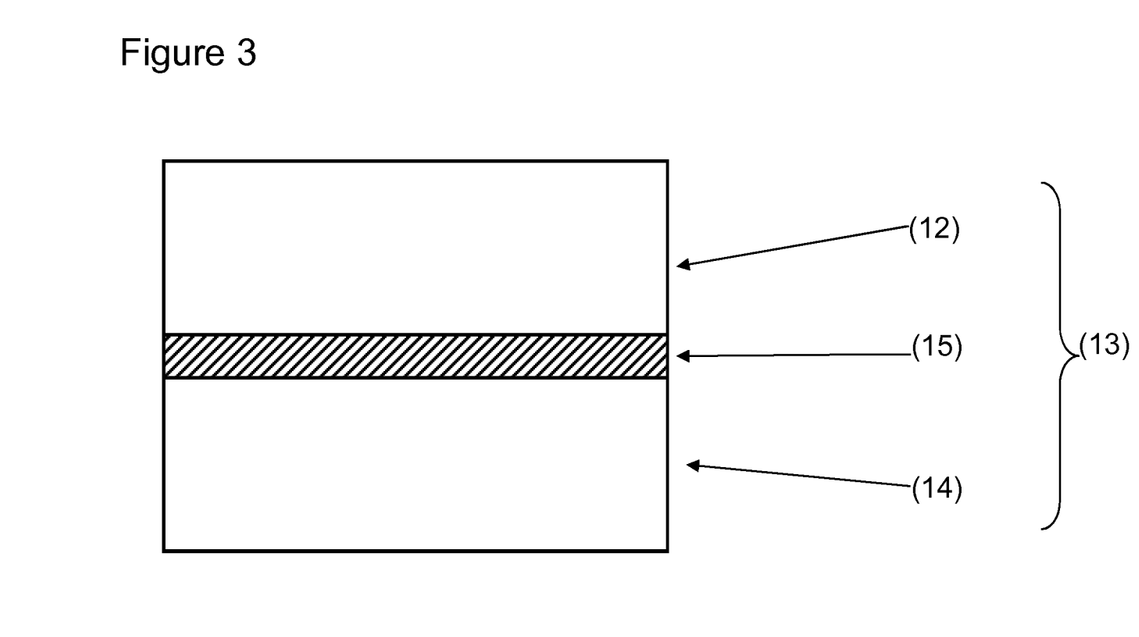
FIG. 3 is a schematic cross section illustrating an example of our back face protection sheet for solar cell modules.
Figure 4:
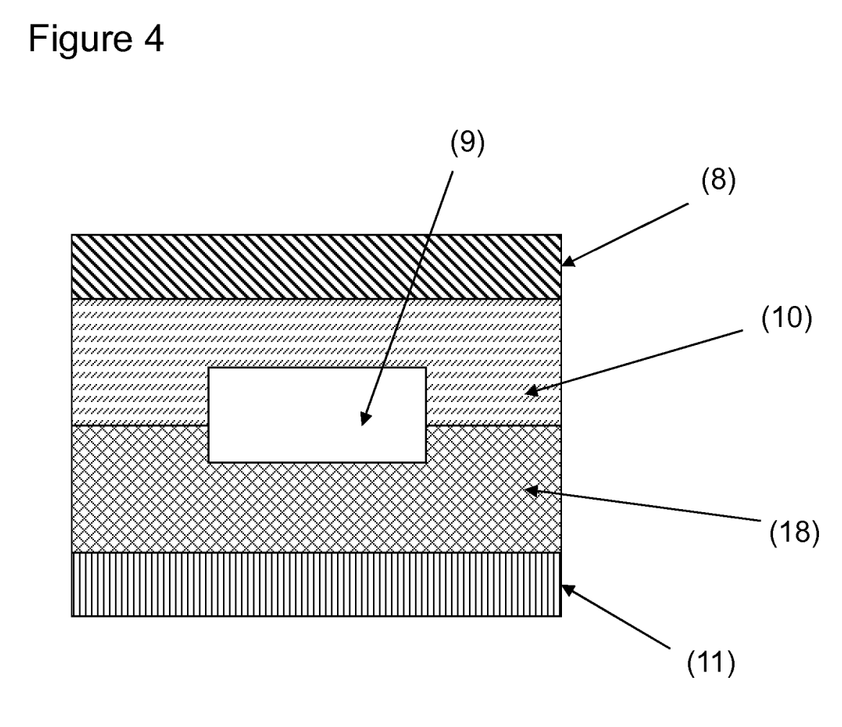
FIG. 4 is a schematic cross section illustrating an example of our solar cell module.

FIGS. 1, 2, and 3 each are a cross section of an example layer constitution of the back face protection sheet for solar cell modules. FIG. 4 is a cross section of an example layer constitution of the solar cell module including the back face protection sheet for solar cell modules.

The solar cell module back face protection sheet (11) may be in the form of a solar cell module back face protection sheet (7) consisting mainly of a polyethylene film (1), white plastic film (2), and hydrolysis resistant polyethylene terephthalate film (3) stacked and bonded in that order with adhesive layers (4) and (5), or a solar cell module back face protection sheet (17) consisting mainly of a polyethylene film (1), black plastic film (16), and hydrolysis resistant polyethylene terephthalate film (3) stacked and bonded in that order with adhesive layers (4) and (5), or a solar cell module back face protection sheet (13) consisting mainly of a white polyethylene film or white polypropylene film (12) and hydrolysis resistant polyethylene terephthalate film (14) bonded with an adhesive layer (15).

It is preferable that after treatment at 120° C. and 100% RH for 48 hours, the hydrolysis resistant polyethylene terephthalate film (hereinafter abbreviated as hydrolysis resistant PET film) to be used maintains 10% or more of the tensile strength measured before the treatment (tensile strength retention rate of 10% or more) and that after treatment at 120° C. and 100% RH for 48 hours, it maintains 10% or more of the elongation at break measured before the treatment (elongation at break retention rate of 10% or more). For both tensile strength and elongation at break, the retention rate is more preferably 60% or more, and most preferably 80% or more.

It is preferable that the hydrolysis resistant PET film is a biaxially oriented film from the viewpoint of mechanical strength, heat resistance, dielectric strength, dimensional stability, chemical resistance, weather resistance and the like.

It is preferable that the hydrolysis resistant PET film has a thickness of 50 to 300 μm, more preferably 75 to 250 μm from the viewpoint of the stiffness and dielectric strength of the film, various costs required for the solar battery back face protection sheet, and processing suitability during production of the solar battery cell.

Specifically, the hydrolysis resistant PET film is of a polyethylene terephthalate material which contains ethylene terephthalate units in a proportion of 90 mol % or more and one polymerization catalyst metal compound selected from the group consisting of antimony, germanium, and titanium compounds, and the polymerization catalyst metal compound accounts for 0.2 to 1 mol/ton in terms of metal quantity relative to the polyethylene terephthalate. The film is produced from a polyethylene terephthalate composition in which cyclic ethylene terephthalate trimers account for 0.5 wt % or less of the entire quantity.

The aforementioned polyethylene terephthalate material may be a copolymer with additional copolymerization components such as various dicarboxylic acids, their ester-forming derivatives, and diols in a proportion of 10 mol % or less.

The copolymerizable dicarboxylic acid components include, for instance, isophthalic acid, phthalic acid, 1,4-naphthalene dicarboxylic acid, 1,5-naphthalene dicarboxylic acid, 2,6-naphthalene dicarboxylic acid, 4,4'-diphenyl dicarboxylic acid, 4,4'-diphenyl ether dicarboxylic acid, and 4,4'-diphenyl sulfone dicarboxylic acid. The copolymerizable alicyclic dicarboxylic acid components include 1,4-cyclohexanedicarboxylic acid. The useful diols components include aliphatic, alicyclic, and aromatic diols such as ethylene glycol, 1,2-propanediol, neopentyl glycol, 1,3-butanediol, 1,4-butanediol, 1,5-pentanediol, 1,6-hexanediol, 1,2-cyclohexanedimethanol, 1,3-cyclohexanedimethanol, 1,4-cyclohexanedimethanol, diethylene glycol, triethylene glycol, polyalkylene glycol, and 2,2-bis(4'-β-hydroxyethoxy phenyl) propane. These components may be used singly or two or more thereof may be used in combination.

A polyethylene terephthalate material that can be used preferably as the hydrolysis resistant PET film can be produced by a conventional, generally known method for polyester production. Specifically, a dialkyl ester, which is used as acid component, is subjected to ester interchange reaction with a diol component, and the resulting reaction product is heated under reduced pressure to maintain condensation polymerization while removing the excess portion of the diol component.

More specifically, a hydrolysis resistant PET film suitable can be obtained by biaxially stretching a polyethylene terephthalate material produced from terephthalic acid as dicarboxylic acid component and ethylene glycol as diol component and has an intrinsic viscosity [η] of 0.70 to 1.20, more preferably 0.75 to 1.00. For measurement of the intrinsic viscosity [η], a polyethylene terephthalate film is dissolved in o-chlorophenol used as solvent and the temperature is adjusted to 25° C. This viscosity is in proportion to the polymerization degree of the polyethylene terephthalate. To improve hydrolysis resistance, it is important to increase the polymerization degree of the polyethylene terephthalate material, and the available methods to increase the polymerization degree include the technique of maintaining the polymerization process over a long polymerization period under reduced pressure while removing ethylene glycol and the technique of so-called "solid phase polymerization" in which a polyethylene terephthalate resin polymerized as described above is subjected to crystallization treatment followed by heat treatment at a high temperature under reduced pressure to further increase the polymerization degree. These techniques serve to achieve an intended intrinsic viscosity [η]. An intrinsic viscosity of 0.70 or more is preferable because it will be easy to produce a hydrolysis resistant, heat resistant material, which will serve to produce a back face protection sheet and, in turn, a solar cell module with an increased hydrolysis resistance. On the other hand, an intrinsic viscosity of 1.20 or less ensures a decreased melt viscosity, leading to easy melt extrusion and smooth film production.

To produce a hydrolysis resistant PET film from the above polyethylene terephthalate material, the polyethylene terephthalate material is dried if needed, fed to a conventionally known type melt extruder, extruded through a slit type die to form a sheet, brought in close contact with a metal drum, and cooled to a temperature below the glass transition point of the polyethylene terephthalate material to prepare an unstretched film. A biaxially oriented film can be produced by processing the unstretched film by a commonly known technique for simultaneous biaxial stretching or sequential biaxial stretching. For this processing, an appropriate stretching temperature may be adopted in the range from the glass transition point Tg of the polyethylene terephthalate material up to Tg+100° C., and commonly, a temperature of 80 to 170° C. is preferable from the viewpoint of physical properties of the finally resulting film and productivity. An appropriate draw ratio may be 1.6 to 5.0, preferably 1.7 to 4.5, in both the machine direction and the transverse direction. The stretching speed, furthermore, is preferably 1,000 to 200,000%/min. The stretched film is then subjected to heat treatment. It may be stretched in the transverse direction in a tenter and subsequently supplied to a heat treatment chamber for continuous heat treatment. Alternatively, heat treatment may be carried out by heating in a separate oven or using a heating roller. With respect to the heat treatment conditions, the film is commonly treated at a temperature of 120 to 245° C. for a duration of 1 to 60 seconds. Relaxation treatment may be performed with the aim of increasing the thermal dimensional stability in the transverse direction and the machine direction during the heat treatment.

An adhesive useful to bond the hydrolysis resistant PET film to another film or a layered body is produced by mixing 100 parts by weight of a polyester polyol (a) with 5 to 30 parts by weight of an epoxy resin (b), 5 to 30 parts by weight of a polycarbonate polyol (c), 1 to 10 parts by weight of a carbodiimide compound (d), and 10 to 30 parts by weight of a polyisocyanate compound (e) as a curing agent. The use of such a weather resistant adhesive serves to produce a solar cell module back face protection sheet that has high weather resistance and suffers little deterioration in adhesive strength over time.

The polyester polyol (a), which is the primary component of the adhesive, is produced by condensation polymerization of dicarboxylic acid and polyhydric alcohol, and is typically in the form of a polyester diol produced by condensation polymerization of dicarboxylic acid and a diol. The useful dicarboxylic acids include aliphatic dicarboxylic acids such as malonic acid, glutaric acid, adipic acid, pimelic acid, azelaic acid, sebacic acid, and dodecane dicarboxylic acid; unsaturated dicarboxylic acids such as fumaric acid, and maleic anhydride; and aromatic dicarboxylic acids such as phthalic acid, dimethyl phthalic acid, phthalic anhydride, isophthalic acid, terephthalic acid, and dimethyl terephthalic acid.

The useful polyhydric alcohols include aliphatic glycols such as ethylene glycol, diethylene glycol, triethylene glycol, propylene glycol, dipropylene glycol, 1,3-butanediol, 1,4-butanediol, 2,3-butanediol, neopentyl glycol, 1,5-pentanediol, 1,6-hexanediol, 3-methyl 1,5-pentanediol, 2-ethyl 1,3-hexanediol, 2,2,4-trimethyl 1,3-pentanediol, 1,8-octanediol, and 1,10-decanediol; alicyclic glycols such as cyclohexanediol, cyclohexanedimethanol, and hydrogenated bisphenol A; aromatic glycols such as xylene glycol, bishydroxyethoxy benzene, and bishydroxyethyl terephthalate; and aliphatic triols such as trimethylolpropane, and glycerin. Various generally known polyester polyol resins produced from different combinations of these substances can be used, but in particular, those with a number average molecular weight of 1,000 to 40,000 are preferable, and those with a hydroxyl value of 1 to 30 mgKOH/g are useful. A number average molecular weight of less than 1,000 will lead to an insufficient adhesive strength, while processability, coated film appearance, and solubility will be inferior if it exceeds 40,000.

The useful adhesive components as the epoxy resin (b) include bisphenol epoxy resins produced by copolymerizing bisphenol A or bisphenol F with epichlorohydrin, and those with a number average molecular weight of 500 to 1,500 are preferable. A number average molecular weight of 500 or more will lead to an adhesive with an improved damp heat resistance, while a high solubility in coating materials will be ensured if it is 1,500 or less. The epoxy resin (b) may be, for instance, a bisphenol A type epoxy resin with a number average molecular weight of about 1,000.

When the epoxy resin (b) is added as an adhesive component, a sufficiently high damp heat resistance will not be obtained if the blending quantity is small, while the adhesive will suffer from cissing if the blending quantity is large, and accordingly, it is important that the resin accounts for 5 to 30 parts by weight per 100 parts by weight of the polyester polyol (a).

The common adhesive components to be used as the polycarbonate polyol (c) include polycarbonate diols produced from a diol and a carbonate, and those with a number average molecular weight of 500 to 3,000 and a hydroxyl value of 20 to 200 mgKOH/g are generally adopted from the viewpoint of maintaining weather resistance and adhesive strength. The diols useful for producing polycarbonate diols include diols having no side chain such as ethylene glycol, 1,3-propanediol, 1,4-butanediol, 1,5-pentanediol, 1,6-hexanediol, 1,7-heptanediol, 1,8-octanediol, 1,9-nanodiols, 1,10-dodecanediol, 1,11-undecanediol, and 1,12-dodecanediol; diols having a side chain such as 2-methyl-1,8-octanediol, 2-ethyl-1,6-hexanediol, 2-methyl-1,3-propanediol, 3-methyl-1,5-pentanediol, 2,4-dimethyl-1,5-pentanediol, 2,4-diethyl-1,5-pentanediol, 2-butyl-2-ethyl-1,3-propanediol, and 2,2-dimethyl-1,3-propanediol, and cyclic diols such as 1,4-cyclohexanedimethanol, and 2-bis(4-hydroxycyclohexyl)-propane.

The carbonates generally adopted include dialkyl carbonates such as dimethyl carbonate, diethyl carbonate, dipropyl carbonate, and dibutyl carbonate; diaryl carbonates such as diphenyl carbonate; and alkylene carbonates such as ethylene carbonate, trimethylene carbonate, 1,2-propylene carbonate, 1,2-butylene carbonate, 1,3-butylene carbonate, and 1,2-pentylene carbonate.

Of these, polycarbonate diols produced from an aliphatic diol (1,4-butanediol, 1,5-pentanediol, 1,6-hexanediol, 1,7-heptanediol, etc.) and an ethylene carbonate are preferred.

When the polycarbonate polyol resin (c) is added as an adhesive component, a sufficiently high damp heat resistance will not be obtained if the blending quantity is small, while the adhesive will suffer from a decrease in adhesive strength in spite of maintaining damp heat resistance if the blending quantity is large, and accordingly, it is important that the resin accounts for 5 to 30 parts by weight per 100 parts by weight of the polyester polyol (a).

The adhesive contains a carbodiimide compound (d) to seal carboxyl groups that remain in the adhesive composition or result from hydrolysis to accelerate hydrolysis.

The useful carbodiimide compounds include, for instance, mono- or poly-carbodiimide compounds such as dicyclohexyl carbodiimide, diisopropyl carbodiimide, di-isobutyl carbodiimide, dioctyl carbodiimide, octyl decyl carbodiimide, di-t-butyl carbodiimide, dibenzyl carbodiimide, diphenyl carbodiimide, N-octadecyl-N'-phenyl carbodiimide, N-benzyl-N'-phenyl carbodiimide, N-benzyl-N'-tolyl carbodiimide, di-o-toluyl carbodiimide, di-p-toluyl carbodiimide, bis(p-aminophenyl) carbodiimide, bis(p-chlorophenyl) carbodiimide, bis(o-chlorophenyl) carbodiimide, bis(o-ethyl phenyl) carbodiimide, bis(p-ethyl phenyl) carbodiimide bis (o-isopropyl phenyl) carbodiimide, bis(p-isopropyl phenyl) carbodiimide, bis(o-isobutyl phenyl) carbodiimide, bis(p-isobutyl phenyl) carbodiimide, bis(2,5-dichlorophenyl) carbodiimide, bis(2,6-dimethyl phenyl) carbodiimide, bis(2,6-diethyl phenyl) carbodiimide, bis(2-ethyl-6-isopropyl phenyl) carbodiimide, bis(2-butyl-6-isopropyl phenyl) carbodiimide, bis(2,6-diisopropyl phenyl) carbodiimide, bis(2, 6-di-t-butyl phenyl) carbodiimide, bis(2,4,6-trimethyl phenyl) carbodiimide, bis(2,4,6-triisopropyl phenyl) carbodiimide, bis(2,4,6-tributyl phenyl) carbodiimide, di-β-naphthyl carbodiimide, N-tolyl-N'-cyclohexyl carbodiimide, N-tolyl-N'-phenyl carbodiimide, p-phenylene bis(o-toluyl carbodiimide), p-phenylene bis(cyclohexyl carbodiimide, p-phenylene bis(p-chlorophenyl carbodiimide), 2,6,2',6'-tetraisopropyl diphenyl carbodiimide, hexamethylene bis(cyclohexyl carbodiimide), ethylene bis(phenyl carbodiimide), and ethylene bis(cyclohexyl carbodiimide).

In particular, bis(2,6-diisopropyl phenyl) carbodiimide, and 2,6,2',6'-tetraisopropyl diphenyl carbodiimide are preferable from the viewpoint of reactivity and stability. In addition, commercially available polycarbodiimide compounds may be used preferably as the aforementioned polycarbodiimide compound, and they require no synthesis operations. Such commercial polycarbodiimide compound products include, for instance, various grades of Carbodilite (trade name) supplied by Nisshinbo Chemical Inc.

It is important that the carbodiimide compound (d) has an equivalent carbodiimide weight (molecular weight divided by the number of carbodiimide groups contained in one molecule) is 100 to 1,000 and that it accounts for 1 to 10 parts by weight per 100 parts by weight of the polyester polyol (a). The hydrolysis resistance will not be sufficiently high if it is less than 1 part by weight, while a yellowish hue will cause an appearance problem if it exceeds 10 parts by weight.

The polyisocyanate compound (e) used as a curing agent component in the adhesive is one or more selected from the group consisting of aliphatic, alicyclic, araliphatic, and aromatic ones including, for instance, aliphatic isocyanates such as hexamethylene diisocyanate, pentamethylene diisocyanate, propylene diisocyanate, and butylene diisocyanate; alicyclic isocyanates such as cyclohexane diisocyanate, methylene bis(cyclohexyl isocyanate), and isophorone diisocyanate; araliphatic isocyanates such as xylylene diisocyanate, and tetramethyl xylylene diisocyanate; and aromatic isocyanates such as tolylene diisocyanate, and diphenyl methane diisocyanate. Also useful are adducts, dimmers, trimers, carbodiimide-modified compounds, allophanate-modified compounds, biuret-modified compounds, and nurate-modified compounds of these diisocyanates.

Of the isocyanate based curing agents listed above, hexamethylene diisocyanate based, isophorone diisocyanate based, and xylylene diisocyanate based ones are preferable because of their high weather resistance and coating performance, and biuret-modified hexamethylene diisocyanates and nurate-modified hexamethylene diisocyanates are particularly preferable because of their high commercial availability.

The polyisocyanate compound (e) will fail to cure the adhesive sufficiently if its blending quantity is small, while the adhesive will suffer from a decrease in adhesive strength if the blending quantity is large, and accordingly, it is important that it accounts for 10 to 30 parts by weight per 100 parts by weight of the polyester polyol (a) used as the base resin.

The preferable solvents suitable for use with the adhesive include ester based, ketone based, aliphatic, and aromatic solvents that have no active hydrogen. The ester based ones include ethyl acetate, acetic acid propyl, and butyl acetate. The ketone based ones include acetone, methyl ethyl ketone, methyl isobutyl ketone, and cyclohexanone. The aliphatic ones include n-heptane, n-hexane, and cyclohexane. The aromatic ones include toluene and xylene. Of these, ethyl acetate, acetic acid propyl, and methyl ethyl ketone are particularly preferable from the viewpoint of solubility and coating performance.

The adhesive layer preferably has a thickness of 0.1 to 10 µm, more preferably 2 to 6 µm from the viewpoint of cost and adhesiveness.

To produce a layered body, a hydrolysis resistant PET film, for instance, is combined with a layered body or another film by one of generally known methods including, for instance, various coating methods such as gravure roll coating, roll coating, reverse coating, and kiss coating, and the adhesive lamination method that use a printing technique to apply an adhesive. Here, the hydrolysis resistant PET film may be subjected to surface treatment such as corona treatment and plasma treatment, as needed, to improve adhesiveness. FIG. 3 shows a schematic sectional side view of an example of the resulting solar cell module.

A hydrolysis resistant PET film is bonded to a layered body or another film by a method as described above using an adhesive as specified. Preferable examples of such a layered body and film are described below.

A polyethylene film to be used as a preferable component of the layered body preferably has a density of 0.910 to 0.945 g/cm$^3$ and a melting point of 110° C. or more. A polyethylene film itself should have adhesiveness to ethylene-vinyl acetate copolymer sheets (hereinafter abbreviated as EVA sheets) that are used as encapsulant sheets in the solar cell module, and therefore, it is not necessary to additionally provide an adhesive resin layer in contact with them. To ensure reliable adhesion, however, adhesive resin layers of polyethylene based resin may be provided, and the surface to be bonded with an EVA sheet or the surface to be bonded with a terminal box may be subjected to surface treatment such as corona treatment and plasma treatment. It is not preferable for the polyethylene film to have a density less than 0.910 g/cm$^3$ because poor slip properties and air trapping can take place to cause poor film appearance. A density of 0.945 g/cm$^3$ or more is not preferable because in that case, films may be torn or the film surface may be scrubbed by a driving roll to release powder during converting processes such as lamination, leading to defective appearance, although the films can have high stiffness and slip properties.

The polyethylene based resin in the polyethylene film may be a homopolymer of ethylene, and also may be a copolymer with another α-olefin monomer with a carbon number of 4 to 8. It is also possible to enhance the adhesion with an EVA sheet by using a polyethylene graft-polymerized with a carboxylic acid such as maleic anhydride. It is preferable that the sheet made of a polyethylene based resin has a thickness of 10 µm to 1,000 µm from the viewpoint of weather resistance, moisture resistance, and molding processability, more preferably 25 µm to 150 µm from the viewpoint of price.

The polyethylene film can be molded by a generally known method, and specifically, the preferable molding methods include calender molding, extrusion molding, and press molding.

It is also preferable to add an ultraviolet ray screening agent, ultraviolet absorber, and antioxidant to the polyethylene film to ensure enhanced performance reliability.

Such an ultraviolet ray screening agent, ultraviolet absorber, and antioxidant will act effectively to enhance the weather resistance after being dispersed in the resin. Major ultraviolet ray screening agents include titanium oxide, zinc oxide, and carbon black, but practically, titanium oxide of a rutile type crystal structure is preferable because it suffers from little coloring due to weather resistance degradation. Titanium oxide can improve weather resistance mainly because it blocks ultraviolet ray, and its preferable content is 1 to 10 wt %. Sufficient ultraviolet screening effect cannot be achieved if it is less than 1 wt %, while the ultraviolet screening effect will no longer improve if it exceeds 10 wt %.

The useful antioxidants and ultraviolet absorbers include those commonly used for plastic sheets and films, while the useful antioxidants include phenol derivatives, allyl amine derivatives, and phosphites. The ultraviolet absorbers can be divided into two groups: organic ultraviolet absorbers and inorganic ultraviolet absorbers. Organic ultraviolet absorbers are preferable and, specifically, they include benzophenone derivatives, salicylic acid esters, benzotriazole derivatives, piperidine derivatives, benzoate derivatives, tin organic compounds, and thiazolidone. A hindered amine based or phenolic radical scavenger may be used in combination, as required The white plastic films that can be used as a preferable component of the layered body include polyester films such as polyethylene terephthalate, and polyethylene naphthalate, polyolefin films such as polyethylene and polypropylene, and others such as polystyrene film, polyamide film, polyvinyl chloride film, polycarbonate film, polyacrylonitrile film, and polyimide film, that contain a white coloring agent or a foamed layer.

The useful white coloring agents include, for instance, basic lead carbonate, basic lead sulfate, basic lead silicate, zinc oxide, zinc sulfide, lithopone, antimony trioxide, anatase type titanium oxide, rutile type titanium oxide, silica, aluminum oxide, magnesium oxide, calcium carbonate, barium sulfate, and other white pigments, which may be used singly or as a combination of two or more thereof. It is preferable that such white coloring agents account for 10 to 30 wt % relative to the plastic film.

It is more preferable that the white plastic film is a white polyethylene terephthalate film from the viewpoint of processability, heat resistance, and economic efficiency. As a method to produce a white polyethylene terephthalate film, a white coloring agent may be kneaded in a biaxially oriented polyethylene terephthalate film or a foamed layer is formed in such a film to make it white. A white colored biaxially oriented polyethylene terephthalate film can serve to reflect or diffuse sunlight back to the solar battery cell so that it is re-used to improve power generation efficiency.

It is preferable that the white plastic film has a thickness of 5 to 200 μm, more preferably 25 to 125 μm from the viewpoint of sunlight reflectivity, cost for the solar battery back face protection sheet, and processing suitability during production of the solar battery cell.

The black plastic films that can be used as a preferable component of the layered body include polyester films such as polyethylene terephthalate, and polyethylene naphthalate, polyolefin films such as polyethylene and polypropylene, and others such as polystyrene film, polyamide film, polyvinyl chloride film, polycarbonate film, polyacrylonitrile film, and polyimide film, that contain a black coloring agent.

The major black coloring agents include carbon black, and it is preferable that carbon black particles have an average secondary particle diameter of 0.1 to 3.0 μm. It is preferable that such carbon black particles account for 0.5 to 35 wt % relative to the plastic film.

It is more preferable that the black plastic film is a black polyethylene terephthalate film, more preferably a biaxially oriented polyethylene terephthalate film from the viewpoint of processability, transparency, heat resistance, and price. A biaxially oriented polyethylene terephthalate film can be made black by adding carbon black particles. Black coloring of the biaxially oriented polyethylene terephthalate film serves to enhance its design characteristics as a component of an installed solar cell module.

It is preferable that the black plastic film has a thickness of 5 to 200 μm, more preferably 25 to 125 μm from the viewpoint of design characteristics as a component of an installed solar cell module, cost for the solar battery back face protection sheet, and processing suitability during production of the solar battery cell.

The layered body to be bonded to a hydrolysis resistant polyethylene terephthalate film is preferably one containing a polyethylene film and a white plastic film or one containing a polyethylene film and a black plastic film as described above that are bonded together with an adhesive of a composition similar to that of the adhesive.

The strength of adhesion between the polyethylene film and white plastic film or between the polyethylene film and black plastic film is preferably 2 N/15 mm or more. If the adhesive strength between these films is 2 N/15 mm or more, the stacked films will have a sufficiently high interlayer strength, serving to prevent interlayer peeling during fabrication of solar cell modules or accelerated tests, and it is more preferably 6 N/15 mm or more.

To produce a layered body containing a polyethylene film and a white plastic film or containing a polyethylene film and a black plastic film bonded together with an adhesive, these films may be combined with a layered body or another film by one of generally known methods including various coating methods such as gravure roll coating, roll coating, reverse coating, and kiss coating, and the adhesive lamination method that use a printing technique to apply an adhesive. Such a layered body or another film as described above may be subjected to surface treatment such as corona treatment and plasma treatment, as needed, to improve adhesiveness.

The white polyethylene film to be combined with the hydrolysis resistant polyethylene terephthalate film is a multi-layered white polyethylene film such as a three-layered film with a structure of A1 layer/B1 layer/C1 layer, where, for instance, the A1 layer is composed mainly of a resin containing an ethylene/α-olefin copolymer with a density of 0.92 g/cm$^3$ to 0.95 g/cm$^3$ as primary component mixed with a low density polyethylene and a propylene based resin, the B1 layer composed mainly of an ethylene/α-olefin copolymer material containing 100 parts by weight of a resin component and 5 to 30 parts by weight of rutile type titanium oxide particles coated with inorganic oxide and having an average particle diameter of 0.2 to 0.5 μm, and the C1 layer composed mainly of an ethylene/α-olefin copolymer with a density of 0.92 g/cm$^3$ to 0.95 g/cm$^3$ mixed with a low density polyethylene, propylene based resin, and inorganic and/or organic particles with an average particle diameter of 1 to 5 µm, although it is not limited to this configuration and may be a polyethylene based film containing, as white coloring agent, fine particles such as of titanium oxide, silica, alumina, calcium carbonate, and barium sulfate, in a proportion of 5 to 30 parts by weight per 100 parts by weight of the resin component, or containing a fluorescent brightening agent such as thiophene-diyl in a proportion of 0.01 to 1 parts by weight per 100 parts by weight of the resin component to further enhance the degree of whiteness.

It is preferable that the white polyethylene film has a thickness of 25 µm to 1,000 µm from the viewpoint of weather resistance, moisture resistance, and molding processability, more preferably 50 µm to 300 µm from the viewpoint of price.

The white polypropylene film to be bonded to the hydrolysis resistant polyethylene terephthalate film is, for instance, a white polypropylene based multi-layered film with a structure of A2 layer/B2 layer/C2 layer, where the A2 layer is formed of a mixture of polyethylene and a polypropylene based resin, the B2 layer formed of a propylene based resin containing 5 to 50 wt % of a white coloring agent, and the C2 layer formed of a propylene based resin.

It is preferable that the white polypropylene film has a thickness of 25 µm to 1,000 µm from the viewpoint of weather resistance, moisture resistance, and molding processability, more preferably 50 µm to 300 µm from the viewpoint of price.

The strength of adhesion between the hydrolysis resistant PET film and the other layered body or film is preferably 2 N/15 mm or more. If the adhesive strength is 2 N/15 mm or more, the stacked films will have a sufficiently high interlayer strength, serving to prevent interlayer peeling during fabrication of solar cell modules or accelerated tests, and the adhesive strength is more preferably 6 N/15 mm or more.

In the layered body, it is preferable that the adhesive strength at all adhesive interfaces is maintained at 2 N/15 mm or more after storage for 1,000 hours under the conditions of 85° C. and 85% RH in order to prevent the solar battery back face protection sheet from suffering from interlayer peeling in its use environment.

It is also preferable that the solar cell module back face protection sheet after storage for 48 hour at 120° C. and 100% RH has a tensile strength that is 60% or more of the tensile strength measured before the test.

Described below is the method of producing a solar cell module including the solar cell module back face protection sheet.

A solar cell module is produced by stacking a surface protection sheet (8) for solar cell modules, a encapsulant layer (10), a photovoltaic cell (9) containing wiring and working as photovoltaic element, a encapsulant layer (18), and the solar cell module back face protection sheet (11) disposed in that order, adding other interlayer materials as necessary, and subjecting the aforementioned layers to thermocompression bonding molding to form an integrated body by using a conventional molding method such as lamination that uses vacuum aspiration or the like to integrate them by thermocompression bonding, followed by attaching a frame.

It is preferable that the surface protection sheet (8) for solar cell modules that serves as part of the solar cell module has physical and chemical strength characteristics such as optical transparency, insulating properties, weather resistance, heat resistance, light resistance, water resistance, moisture resistance, and antifouling properties. The aforementioned surface protection sheet may be a resin film or sheet of glass, polyamide based resin (various types of nylon), polyester based resin, cyclic polyolefin resin, polystyrene based resin, (meth)acrylic resin, polycarbonate based resin, acetal based resin, or other various resins.

It is preferable that the encapsulant layer (10) that underlies the surface protection sheet for solar cell modules has weather resistance, heat resistance, and transparency. Specifically, the encapsulant layer may be formed of, for instance, an ethylene-vinyl acetate copolymer, ionomer resin, ethylene-acrylic acid copolymer, acid-modified polyolefin resin, polyvinylbutyral resin, silicone based resin, epoxy based resin, (meth) acrylic resin, and other resins, which may be used singly or as a mixture of two or more thereof The photovoltaic cell (9) working in the solar cell module as photovoltaic element may be one of the conventional, generally known ones including, for instance, crystal silicon solar electronic elements such as single crystal silicon type photovoltaic cell and polycrystalline silicon type photovoltaic cell; amorphous silicon photovoltaic cells such as single junction type and tandem structure type; III-V compound semiconductor solar electronic elements such as of gallium arsenide (GaAs) and indium phosphide (InP), II-VI compound semiconductor solar electronic elements such as of cadmium telluride (CdTe) and copper indium selenide ($CuInSe_2$), and organic photovoltaic cells. Furthermore, it is also possible to use a hybrid element composed mainly of a thin-film polycrystalline silicon photovoltaic cell, thin-film microcrystalline silicon photovoltaic cell, or thin-film crystal silicon photovoltaic cell, combined with an amorphous silicon photovoltaic cell.

The encapsulant layer (18) underlining the photovoltaic element working as part of the solar cell module may be of the same material as that of the encapsulant layer that underlines the solar cell module surface protection sheet. It is preferable that the encapsulant layer is adhesive to the back face protection sheet. It is preferable that the encapsulant layer has thermoplasticity so as to function to maintain the smoothness of the back face of the photovoltaic cell serving as photovoltaic element, and also has high scratch resistance, impact absorbability and the like to protect the photovoltaic cell serving as photovoltaic element.

The frame of the solar cell module is preferably of aluminum.

EXAMPLES

Hydroxyl Value

The hydroxyl value (mgKOH/g) is defined as the weight in mg of potassium hydroxide required to acetylate the hydroxyl groups contained in 1 g of an adhesive composition specimen.
Evaluation Method
Configuration of Back Face Protection Sheet for Solar Cell Modules Table 1 lists members of the solar cell module back face protection sheet and components of the adhesives used.
Adhesive Strength A specimen with a width of 15 mm was cut out of a solar cell module back face protection sheet, and each layer film was separated at the interface. The initial adhesive strength was determined as the peeling strength measured by an Orientec Tensilon PTM-50 tester under the conditions of a peeling angle of 180° and a peeling speed of 100 mm/min.

Then, a specimen with a width of 15 mm was cut out of a solar cell module back face protection sheet and the adhesive strength was measured by the procedure described above using an Espec PR-2KPH constant temperature humidistat after storage for 1,000 hours in an environment with a temperature of 85° C. and humidity of 85% RH.

Tensile Strength

A specimen with a length of 100 mm in the sheet machine direction and a width of 10 mm in the transverse direction was cut out of a solar cell module back face protection sheet, set in a Minebea TCM-50 universal tensile compression testing machine, with the measuring distance adjusted to 55 mm, and pulled at a tensile speed of 300 mm/min. The load at the time of rupture was measured, and the initial tensile strength (MPa (=N/mm$^2$)) was calculated by dividing the load by the cross-sectional area.

Then, specimens with a length of 100 mm in the sheet machine direction and a width of 10 mm in the transverse direction were cut out of a solar cell module back face protection sheet, and the tensile strength (MPa (=N/mm$^2$)) was measured by the procedure described above using an Espec HAST chamber (EHS-221MD) after storage for 24 hours or 48 hours in an environment with a temperature of 120° C. and humidity of 100% RH (PCT test).

Tensile strength retention rate of PET film

A specimen with a length of 100 mm in the sheet machine direction and a width of 10 mm in the transverse direction was cut out of a hydrolysis resistant PET film or non-hydrolysis-resistant PET film, set in a Minebea TCM-50 universal tensile compression testing machine, with the measuring distance adjusted to 55 mm, and pulled at a tensile speed of 300 mm/min. The load at the time of rupture was measured, and the initial tensile strength (MPa (=N/mm$^2$)) was calculated by dividing the load by the cross-sectional area.

Then, a specimen with a length of 100 mm in the machine direction and a width of 10 mm in the transverse direction was cut out of a solar cell module back face protection sheet, and the tensile strength (MPa (=N/mm$^2$)) was measured by the procedure described above using an Espec HAST chamber (EHS-221MD) after storage for 48 hours in an environment with a temperature of 120° C. and humidity of 100% RH (PCT test). The tensile strength retention rate (%) was calculated by dividing the tensile strength measured after storage for 48 hours under the PCT test conditions by the initial tensile strength and multiplying the quotient by 100.

Elongation at break retention rate of PET film

A specimen with a length of 100 mm in the sheet machine direction and a width of 10 mm in the transverse direction was cut out of a hydrolysis resistant PET film or non-hydrolysis-resistant PET film, set in a Minebea TCM-50 universal tensile compression testing machine, with the measuring distance adjusted to 55 mm, and pulled at a tensile speed of 300 mm/min. The elongation of the specimen at the time of rupture was measured, and the initial elongation at break (%) was calculated as percent elongation relative to the measuring distance of 55 mm.

Then, a specimen with a length of 100 mm in the machine direction and a width of 10 mm in the transverse direction was cut out of a solar cell module back face protection sheet, and the elongation at break (%)) was measured by the procedure described above using an Espec HAST chamber (EHS-221MD) after storage for 48 hours in an environment with a temperature of 120° C. and humidity of 100% RH (PCT test). The elongation at break retention rate (%) was calculated by dividing the elongation at break measured after storage of 48 hours under the PCT test conditions by the initial elongation at break and multiplying the quotient by 100.

Overall Evaluation

The evaluation results for adhesive strength and tensile strength were combined, and each specimen of a solar cell module back face protection sheet was ranked as A if it meets the following criteria for both adhesive strength and tensile strength while it was ranked as B if it fail to meet the following criteria for either or both of adhesive strength and tensile strength. Results of overall evaluation are given in Table 2.

The adhesive strength at all adhesive interfaces is 2 N/15 mm or more, and the value of 2 N/15 mm or more is maintained after storage for 1,000 hours under conditions of 85° C. and 85% RH.

The tensile strength measured after 48-hour acceleration test at 120° C. and 100% RH is 60% or more of the tensile strength measured before the test.

Example 1

A base resin composed of 100 parts by weight of Dicdry LX-71A (supplied by DIC), which contains polyester polyol as adhesive resin component and has a number average molecular weight of 5,000 and a hydroxyl value of 11 mgKOH/g, 10 parts by weight of Epicron 1050 (supplied by DIC) as epoxy resin, and 15 parts by weight of Placcel CD210 (supplied by Daicel Chemical Industries, Ltd.), which has a number average molecular weight of 1,000 and a hydroxyl value of 110 mgKOH/g, as polycarbonate polyol, mixed with 17 parts by weight of Desmodur N3300 (supplied by Sumitomo Bayer Urethane Co., Ltd.), which is a nurate-modified hexamethylene diisocyanate, as isocyanate based curing agent and 2 parts by weight of Carbodilite V-07 (supplied by Nisshinbo Chemical Inc.), which has an equivalent carbodiimide group weight of 200, as carbodiimide compound, was applied to a solid coating thickness of 5 μm over a white plastic film (Lumirror (registered trademark) E20F, 50 μm, supplied by Toray Industries, Inc.) using a adhesive laminator (adhesive laminator equipped with monocolor printer OG/DL-130TA-AF, supplied by Okazaki Machine Industry Co., Ltd.), followed by drying and lamination with an unstretched polyethylene film (Type 4801, 50 μm, supplied by Toray Advanced Film Co., Ltd.) under a nip pressure of 60 N/cm.

Then, the adhesive was applied over a hydrolysis resistant, biaxially oriented plastic film (Lumirror (registered trademark) X10S, 125 μm, supplied by Toray Industries, Inc.) and the surface of the white plastic film in the above laminate film using a adhesive laminator as described above to a solid coating thickness of 5 μm, followed by drying and lamination under a nip pressure of 60 N/cm.

For the hydrolysis resistant biaxially oriented plastic film (Lumirror (registered trademark) X10S, 125 μm, supplied by Toray Industries, Inc.), the tensile strength measured after treatment for 48 hours at 120° C. and 100% RH was 80% of the tensile strength measured before treatment (tensile strength retention rate of 80%), and the elongation at break measured after treatment for 48 hours at 120° C. and 100% RH was 95% of the elongation at break measured before treatment (elongation at break retention rate of 95%).

The laminated film was aged for 72 hours at a temperature of 40° C. to ensure curing of the two adhesive layers, and used to produce our solar cell module back face protection sheet.

Example 2

A solar cell module back face protection sheet was prepared by the same procedure as in Example 1 except for using Elitel XO-0276 (supplied by Unitika Ltd.), which has a number average molecular weight of 20,000 and a hydroxyl value of 4 mgKOH/g, as polyester polyol resin component of the adhesive, 7 parts by weight of Epicron 1050 as epoxy resin, and 4 parts by weight of Carbodilite V-07 as carbodiimide compound.

Example 3

A solar cell module back face protection sheet was prepared by the same procedure as in Example 1 except for using Beckolite M-6180-50 (supplied by DIC), which has a number average molecular weight of 6,000 and a hydroxyl value of 21 mgKOH/g, as polyester polyol resin component of the adhesive, 25 parts by weight of Epicron 1050 as epoxy resin, 10 parts by weight of Placcel CD210 as polycarbonate polyol, 25 parts by weight of Desmodur N3300 as isocyanate based curing agent, and 7 parts by weight of Carbodilite V-07 as carbodiimide compound.

Example 4

A solar cell module back face protection sheet was prepared by the same procedure as in Example 1 except for using a base resin composed of Aron Melt PES-375SE50 (supplied by Toagosei Co., Ltd.), which, as polyester polyol, has a number average molecular weight of 13,000 and a hydroxyl value of 11 mgKOH/g, as adhesive resin component and 25 parts by weight of Placcel CD210 as polycarbonate polyol, along with 13 parts by weight of Desmodur N3300 as isocyanate based curing agent and 4 parts by weight of Carbodilite V-07 as carbodiimide compound.

Example 5

A solar cell module back face protection sheet was prepared by the same procedure as in Example 1 except for using 17 parts by weight of Desmodur N3200 (supplied by Sumitomo Bayer Urethane Co., Ltd.), which is a biuret-modified hexamethylene diisocyanate, as isocyanate based curing agent in the adhesive resin component.

Example 6

A solar cell module back face protection sheet was prepared by the same procedure as in Example 3 except for using 25 parts by weight of Desmodur N3200 as isocyanate based curing agent in the adhesive resin component.

Example 7

A solar cell module back face protection sheet was prepared by the same procedure as in Example 1 except for using a black plastic film (Lumirror (registered trademark) X30, 50 µm, supplied by Toray Industries, Inc.) to laminate the unstretched polyethylene film (Type 4801, 50 µm, supplied by Toray Advanced Film Co., Ltd.).

Example 8

A solar cell module back face protection sheet was prepared by the same procedure as in Example 1 except for using a white polyethylene film (Type 4806W, 150 µm, supplied by Toray Advanced Film Co., Ltd.) to laminate the hydrolysis resistant PET film.

The above Type 4806W film has a three-layered A1 layer/B1 layer/C1 layer structure where the A1 layer is composed of 100 parts by weight of an ethylene/α-olefin copolymer (straight-chain, low density polyethylene) having a density of 0.93 g/cm$^3$ and a MFR of 5 g/10 min, 3.5 parts by weight of a low density polyethylene having a density of 0.90 g/cm$^3$ and a MFR of 7 g/10 min, and as propylene based resin, 10.5 parts by weight of a homopolypropylene having a density of 0.90 g/cm$^3$ and a MFR of 8 g/10 min, the B1 layer composed of 100 parts by weight of a straight-chain, low density polyethylene having a density of 0.92 g/cm$^3$ and a MFR of 5 g/10 min and 20 parts by weight of rutile type titanium oxide particles having an average particle diameter of 0.3 µm and coated with inorganic oxide, and the C1 layer composed of the same resin composition as that for the A1 layer combined with a master batch aluminum silicate (Silton JC30, supplied by Mizusawa Industrial Chemicals, Ltd.) having an average particle diameter of 2 µm, with the aluminum silicate content adjusted to 0.3 wt %. These resin compositions were molded by a generally known co-extrusion method while adjusting the A1/B1/C1 layer thickness ratio to 20/70/10.

Example 9

A white polypropylene film was used to laminate the hydrolysis resistant PET film. This white polypropylene film was a three layered film with a structure of A2 layer/B2 layer/C2 layer where the resin used for the A2 layer was a resin mixture produced by mixing 85 parts by weight of a 1-butene-copolymerized straight-chain, low density polyethylene having a melting point of 127° C., a density of 0.94 g/cm$^3$, and a melt flow rate of 5 g/10 min, 15 parts by weight of a low density polyethylene having a melting point 112° C. and a density 0.91 g/cm$^3$, and, as propylene based resin, 80 parts by weight of an ethylene-propylene random copolymer having a melting point 150° C. and a density 0.900 g/cm$^3$.

The resin used for the B2 layer was a resin mixture produced by mixing 100 parts by weight of a homopolypropylene having a melting point of 160° C. and density of 0.90 g/cm$^3$, and 12 parts by weight of a titanium oxide master batch (containing 60 wt % of titanium oxide relative to the homopolypropylene base material). The titanium oxide added accounted for 6.4 wt %.

An ethylene-propylene block copolymer resin having a melting point of 160° C. and a density of 0.900 g/cm$^3$ was used as the resin for the C2 layer. These resin compositions were molded by a generally known co-extrusion method while adjusting the A2/B2/C2 layer thickness ratio to 20/70/10 and the total thickness to 150 µm.

Comparative Example 1

A solar cell module back face protection sheet was prepared by the same procedure as in Example 2 except for using Beckolite M-6180-50 as polyester polyol component of the adhesive resin and adding no epoxy resin or polycarbonate polyol component.

Comparative Example 2

A solar cell module back face protection sheet was prepared by the same procedure as in Example 2 except for using Dicdry LX-71A as polyester polyol component of the adhesive resin and adding no epoxy resin component.

Comparative Example 3

A solar cell module back face protection sheet was prepared by the same procedure as in Example 2 except for using Beckolite M-6180-50 as polyester polyol component of the adhesive resin and 50 parts by weight of Epicron 1050 as epoxy resin.

When the adhesive was applied to the white plastic film, cissing of the adhesive took place to cause a thickness defect in the adhesive layer, resulting in bubbles being formed after lamination with an unstretched polyethylene film and, therefore, it was impossible to perform evaluation for tensile strength and adhesive strength.

Comparative Example 4

A solar cell module back face protection sheet was prepared by the same procedure as in Example 2 except for using Beckolite M-6180-50 as polyester polyol component of the adhesive resin, 18 parts by weight of Epicron 1050 as epoxy resin, and 50 parts by weight of Placcel CD210 as polycarbonate polyol.

Comparative Example 5

A solar cell module back face protection sheet was prepared by the same procedure as in Example 1 except for using Beckolite M-6180-50 as polyester polyol component of the adhesive resin, 10 parts by weight of Epicron 1050 as epoxy resin, and 2 parts by weight of Placcel CD210 as polycarbonate polyol.

Comparative Example 6

A solar cell module back face protection sheet was prepared by the same procedure as in Example 1 except for using 15 parts by weight of Placcel CD210 as polycarbonate polyol component of the adhesive resin, and 40 parts by weight of Desmodur N3300 as isocyanate based curing agent.

Comparative Example 7

A solar cell module back face protection sheet was prepared by the same procedure as in Example 1 except for using 5 parts by weight of Desmodur N3300 as isocyanate based curing agent component of the adhesive resin.

The laminated film was aged for 72 hours at a temperature of 40° C. However, the two adhesive layers were not cured sufficiently and, therefore, it was impossible to perform evaluation for tensile strength and adhesive strength.

Comparative Example 8

A solar cell module back face protection sheet was prepared by the same procedure as in Example 1 except for adding no carbodiimide compound as an adhesive resin component.

Comparative Example 9

A solar cell module back face protection sheet was prepared by the same procedure as in Example 1 except for using Beckolite M-6180-50 as polyester polyol of the adhesive resin and 15 parts by weight of Carbodilite V-07 as carbodiimide compound.

Comparative Example 10

A solar cell module back face protection sheet was prepared by the same procedure as in Example 1 except for using 10 parts by weight of a neopentyl glycol diglycidyl ether (supplied by Tokyo Chemical Industry Co., Ltd.) as epoxy compound instead of epoxy resin in the adhesive.

Comparative Example 11

A solar cell module back face protection sheet was prepared by the same procedure as in Example 1 except that the two-layered film composed of a white plastic film and an unstretched polyethylene film was laminated with a non-hydrolysis-resistant biaxially oriented polyethylene terephthalate film (Lumirror (registered trademark) T60, 125 μm, supplied by Toray Industries, Inc.).

For the non-hydrolysis-resistant biaxially oriented polyethylene terephthalate film (Lumirror (registered trademark) T60, 125 μm, supplied by Toray Industries, Inc.), the tensile strength measured after treatment for 48 hours at 120° C. and 100% RH was 5% or less of the tensile strength measured before treatment (tensile strength retention rate of 5% or less), and the elongation at break measured after treatment for 48 hours at 120° C. and 100% RH was 5% or less of the elongation at break measured before treatment (elongation at break retention rate of 5% or less).

TABLE 1

| | Constitution of back face protect sheet | | | | | | | |
|---|---|---|---|---|---|---|---|---|
| | Layered body or film used to laminate hydrolysis-resistant PET film or non-hydrolysis-resistant PET film | PET film strength or elongation retention rate | | Adhesive components (parts by weight) | | | | |
| | | | | Polyester polyol | Epoxy resin | Carbodiimide compound | Polycarbonate polyol | Polyisocyanate compound | |
| | | strength | elongation | | | | | nurate | biuret |
| Example 1 | polyethylene film/white PET film | 80% | 95% | 100 | 10 | 2 | 15 | 17 | 0 |
| Example 2 | polyethylene film/white PET film | 80% | 95% | 100 | 7 | 4 | 15 | 17 | 0 |
| Example 3 | polyethylene film/white PET film | 80% | 95% | 100 | 25 | 7 | 10 | 25 | 0 |
| Example 4 | polyethylene film/white PET film | 80% | 95% | 100 | 10 | 4 | 25 | 13 | 0 |
| Example 5 | polyethylene film/white PET film | 80% | 95% | 100 | 10 | 2 | 15 | 0 | 17 |
| Example 6 | polyethylene film/white PET film | 80% | 95% | 100 | 25 | 7 | 10 | 0 | 25 |
| Example 7 | polyethylene film/black PET film | 80% | 95% | 100 | 10 | 2 | 15 | 17 | 0 |
| Example 8 | white polyethylene film | 80% | 95% | 100 | 10 | 2 | 15 | 17 | 0 |
| Example 9 | white polypropylene film | 80% | 95% | 100 | 10 | 2 | 15 | 17 | 0 |
| Comparative example 1 | polyethylene film/white PET film | 80% | 95% | 100 | 0 | 4 | 0 | 17 | 0 |
| Comparative example 2 | polyethylene film/white PET film | 80% | 95% | 100 | 0 | 4 | 15 | 17 | 0 |

TABLE 1-continued

| | Constitution of back face protect sheet | | | | | | | |
|---|---|---|---|---|---|---|---|---|
| | Layered body or film used to laminate hydrolysis-resistant PET film or non-hydrolysis-resistant PET film | PET film strength or elongation retention rate | | Adhesive components (parts by weight) | | | | |
| | | | | Polyester | Epoxy | Carbodiimide | Polycarbonate | Polyisocyanate compound | |
| | | strength | elongation | polyol | resin | compound | polyol | nurate | biuret |
| Comparative example 3 | polyethylene film/white PET film | 80% | 95% | 100 | 50 | 4 | 15 | 17 | 0 |
| Comparative example 4 | polyethylene film/white PET film | 80% | 95% | 100 | 18 | 4 | 50 | 17 | 0 |
| Comparative example 5 | polyethylene film/white PET film | 80% | 95% | 100 | 10 | 4 | 2 | 17 | 0 |
| Comparative example 6 | polyethylene film/white PET film | 80% | 95% | 100 | 10 | 2 | 15 | 40 | 0 |
| Comparative example 7 | polyethylene film/white PET film | 80% | 95% | 100 | 10 | 2 | 15 | 5 | 0 |
| Comparative example 8 | polyethylene film/white PET film | 80% | 95% | 100 | 10 | 0 | 15 | 17 | 0 |
| Comparative example 9 | polyethylene film/white PET film | 80% | 95% | 100 | 10 | 15 | 15 | 17 | 0 |
| Comparative example 10 | polyethylene film/white PET film | 80% | 95% | 100 | 0 | 2 | 15 | 17 | 0 |
| Comparative example 11 | polyethylene film/white PET film | 1% | 1% | 100 | 10 | 2 | 15 | 17 | 0 |

TABLE 2

| | Tensile strength (strength retention rate) MPa (=N/mm$^2$) ((%)) | | | Adhesive strength (N/15 mm) | | | | |
|---|---|---|---|---|---|---|---|---|
| | | PCT test | | Layered body | | Layered product or film/PET film | | |
| | Initial tensile strength | 120° C., 100% RH | | Initial adhesive strength | 85° C., 85% RH 1,000 hours | Initial adhesive strength | 85° C., 85% RH 1,000 hours | Overall evaluation |
| | | 24 hours | 48 hours | | | | | |
| Example 1 | 161 | 130(81) | 106(66) | 8.8 | 7.2 | 8.8 | 6.8 | A |
| Example 2 | 150 | 125(83) | 100(67) | 8.5 | 3.7 | 8.3 | 3.2 | A |
| Example 3 | 158 | 131(83) | 108(68) | 9.2 | 7.6 | 8.9 | 6.5 | A |
| Example 4 | 153 | 126(83) | 103(67) | 6.2 | 4.0 | 6.7 | 4.6 | A |
| Example 5 | 160 | 128(80) | 100(63) | 7.0 | 5.8 | 8.8 | 6.8 | A |
| Example 6 | 157 | 124(79) | 99(63) | 7.3 | 6.0 | 7.0 | 5.1 | A |
| Example 7 | 165 | 134(81) | 108(65) | 8.2 | 7.3 | 8.7 | 6.6 | A |
| Example 8 | 104 | 98(94) | 88(85) | — | — | 7.1 | 5.0 | A |
| Example 9 | 121 | 112(93) | 102(84) | — | — | 9.0 | 7.0 | A |
| Comparative example 1 | 154 | 125(87) | 100(71) | 9.1 | 1.7 | 9.8 | 1.3 | B |
| Comparative example 2 | 155 | 125(88) | 100(72) | 8.7 | 1.5 | 8.0 | 1.5 | B |
| Comparative example 3 | — | — | — | — | — | — | — | B |
| Comparative example 4 | 160 | 126(79) | 107(67) | 3.2 | 1.9 | 3.5 | 1.8 | B |
| Comparative example 5 | 155 | 125(81) | 105(68) | 8.2 | 1.5 | 8.5 | 1.2 | B |
| Comparative example 6 | 156 | 123(79) | 102(65) | 3.0 | 1.6 | 3.2 | 1.7 | B |
| Comparative example 7 | — | — | — | — | — | — | — | B |
| Comparative example 8 | 160 | 130(81) | 104(65) | 8.6 | 1.9 | 8.3 | 1.7 | B |
| Comparative example 9 | 165 | 133(81) | 110(67) | 3.7 | 1.5 | 3.4 | 1.4 | B |
| Comparative example 10 | 162 | 129(79) | 100(62) | 8.2 | 1.8 | 8.0 | 1.7 | B |
| Comparative example 11 | 135 | 89(66) | 45(33) | 8.8 | 4.9 | 8.9 | 2.9 | B |

What is claimed is:

1. A back face protection sheet for solar cell modules comprising a hydrolysis resistant polyethylene terephthalate film laminated with a white polyethylene film which is a three-layered film with a structure of A1 layer/B1 layer/C1 layer, wherein, the A1 layer is comprises a resin containing an ethylene/α-olefin copolymer with a density of 0.92 g/cm$^3$ to 0.95 g/cm$^3$ as a primary component mixed with a low density polyethylene and a propylene based resin, the B1 layer comprises an ethylene/α-olefin copolymer material containing 100 parts by weight of a resin component and 5 to 30 parts by weight of rutile titanium oxide particles coated with an inorganic oxide and having an average particle diameter of 0.2 to 0.5 µm, and the C1 layer comprises an ethylene/α-olefin copolymer with a density of 0.92 g/cm$^3$ to 0.95 g/cm$^3$ mixed with a low density polyethylene, propylene based resin, and inorganic and/or organic particles with an average particle diameter of 1 to 5 µm by an adhesive produced by mixing 100 parts by weight a polyester polyol (a) with 5 to 30 parts by weight of an epoxy resin (b), 1 to 10 parts by weight of a carbodiimide compound (d), 10 to 30 parts by weight of a polyisocyanate compound (e), and 5 to 30 parts by weight of a polycarbonate polyol (c).

2. The sheet as described in claim 1, wherein an adhesive strength at all adhesive interfaces is 2 N/15 mm or more, and also 2 N/15 mm or more after storage for 1,000 hours under conditions of 85° C. and 85% RH, and a tensile strength measured after 48 -hour acceleration test at 120° C. and 100% RH is 60% or more of a tensile strength measured before the test.

3. The sheet as described in claim 1, wherein the hydrolysis resistant polyethylene terephthalate film after treatment for 48 hours at 120° C. and 100% RH has a tensile strength that is 10% or more of a tensile strength measured before the treatment, and has an elongation at break that is 10% or more of an elongation at break measured before the treatment.

4. A solar cell module comprising the sheet as described in claim 1.

5. A back face protection sheet for solar cell modules comprising a hydrolysis resistant polyethylene terephthalate film laminated with a white polypropylene film which is a white polypropylene based multi-layered film with a structure of A2 layer/B2 layer/C2 layer, wherein the A2 layer is formed of a mixture of polyethylene and polypropylene based resin, the B2 layer formed of a propylene based resin containing 5 to 50 wt % of a white coloring agent, and the C2 layer formed of a propylene based resin by an adhesive produced by mixing 100 parts by weight a polyester polyol (a) with 5 to 30 parts by weight of an epoxy resin (b), 1 to 10 parts by weight of a carbodiimide compound (d), 10 to 30 parts by weight of a polyisocyanate compound (e), and 5 to 30 parts by weight of a polycarbonate polyol (c).

6. The sheet as described in claim 5, wherein an adhesive strength at all adhesive interfaces is 2 N/15 mm or more, and also 2 N/15 mm or more after storage for 1,000 hours under conditions of 85° C. and 85% RH, and a tensile strength measured after 48 -hour acceleration test at 120° C. and 100% RH is 60% or more of a tensile strength measured before the test.

7. The sheet as described in claim 5, wherein the hydrolysis resistant polyethylene terephthalate film after treatment for 48 hours at 120° C. and 100% RH has a tensile strength that is 10% or more of a tensile strength measured before the treatment, and has an elongation at break that is 10% or more of an elongation at break measured before the treatment.

8. The sheet as described in claim 5, wherein the hydrolysis resistant polyethylene terephthalate film after treatment for 48hours at 120° C. and 100% RH has a tensile strength that is 10% or more of a tensile strength measured before the treatment, and has an elongation at break that is 10% or more of an elongation at break measured before the treatment.

9. A solar cell module comprising the sheet as described in claim 5.

* * * * *